United States Patent
Heinz et al.

(10) Patent No.: US 6,573,639 B1
(45) Date of Patent: Jun. 3, 2003

(54) PIEZOELECTRIC ACTUATOR

(75) Inventors: Rudolf Heinz, Renningen (DE); Lothar Henneken, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/937,459

(22) PCT Filed: Oct. 13, 1999

(86) PCT No.: PCT/DE99/03283

§ 371 (c)(1),
(2), (4) Date: Dec. 31, 2001

(87) PCT Pub. No.: WO00/57497

PCT Pub. Date: Sep. 28, 2000

(30) Foreign Application Priority Data

Mar. 24, 1999 (DE) .......................................... 199 13 271

(51) Int. Cl.[7] .............................................. H01L 41/08
(52) U.S. Cl. ........................ 310/363; 310/328; 310/366
(58) Field of Search ................................ 310/363, 364, 310/366, 328

(56) References Cited

U.S. PATENT DOCUMENTS 5,406,164 A   4/1995  Okawa et al.
6,307,306 B1 * 10/2001 Bast et al. .................. 310/366
6,411,018 B1 *  6/2002 Heinz ......................... 310/363

FOREIGN PATENT DOCUMENTS

| DE | 37 13 697 | 11/1988 |
| EP | 0 362 416 | 4/1990 |
| JP | 63 009 168 | 1/1988 |
| JP | 63 169 777 | 4/1988 |
| JP | 06 296 048 | 10/1994 |

* cited by examiner

Primary Examiner—Mark O. Budd
(74) Attorney, Agent, or Firm—Kenyon & Kenyon

(57) ABSTRACT

A piezoelectric actuator has a plurality of disks made of piezoelectric material, arranged to form a stack in a stack direction, a plurality of flat inside electrodes arranged in alternation with the disks made of piezoelectric material, and at least two outside electrodes applied to the outside of the stack along the stack direction, the inside electrodes each being connected in alternation to one of the outside electrodes by a contact zone. The outside electrodes are applied to the outside of the stack in the form of a coating of an elastic, electrically conductive polymer material.

12 Claims, 5 Drawing Sheets

E = 0

Related Art

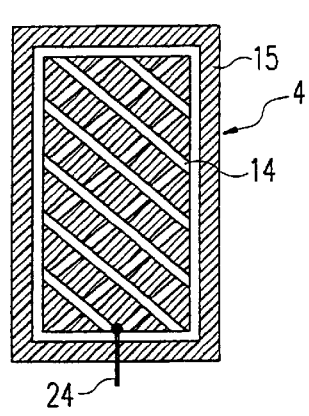
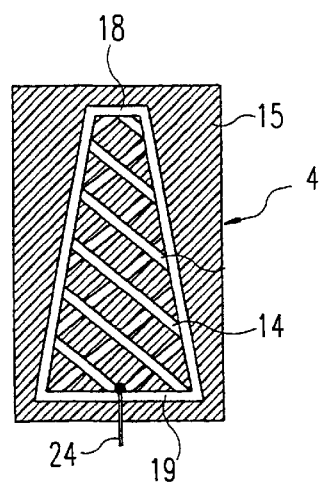
Fig. 8    Fig. 9
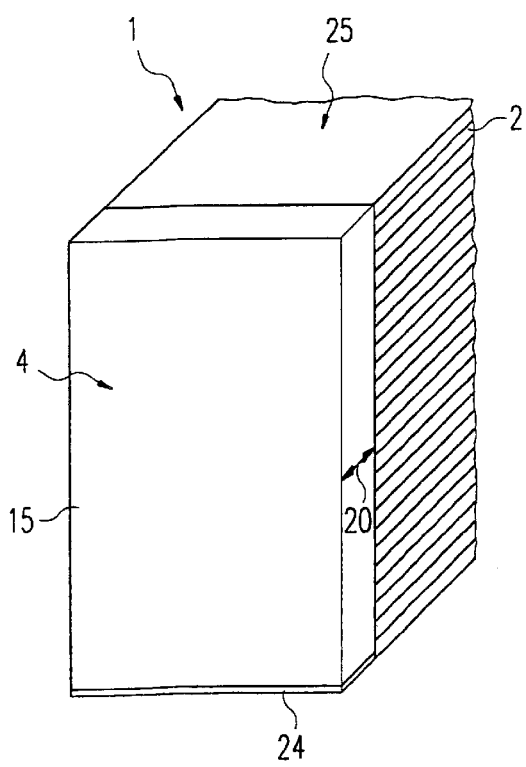
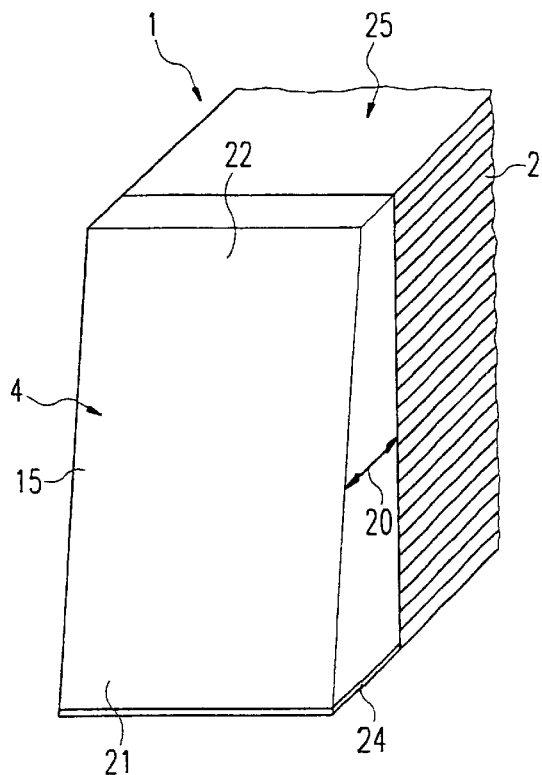
Fig. 10    Fig. 11

PIEZOELECTRIC ACTUATOR

FIELD OF THE INVENTION

The present invention relates to a piezoelectric actuator.

BACKGROUND INFORMATION

A piezoelectric actuator for adjusting an ultra-fast-acting valve is described in German Published Patent Application No. 37 136 97, for example.

FIG. 1 shows a sectional view of a piezoelectric actuator 1 known in the related art. This piezoelectric actuator has disks 2 made of a piezoelectric material, arranged one above the other in the form of a stack 25. Inside electrodes 5 and 6 are arranged between successive disks 2 made of piezoelectric material. Inside electrodes 5, 6 and outside electrodes 3 and 4 arranged on the outside of stack 25 of disks 2 made of piezoelectric material contact one another. Outside electrodes 3 and 4 are each connected electrically to a terminal 11a and 11b of a control voltage source 10. Inside electrodes 5 and 6 are thus connected alternately to terminals 11a and 11b of control voltage source 10 across outside electrodes 3 and 4.

FIGS. 2A and 2B show enlarged views of a circular detail of an edge area of piezoelectric actuator 1 shown in FIG. 1. In the edge area shown in the enlargement, a distinction should be made between area 7 and area 8. In area 7, inside electrode 5 is not contacted through to outside electrode 4 in area 7, and disks 2 made of piezoelectric material are sintered through in area 7. In area 8, inside electrode 6 is connected to outside electrode. 4. The adhesive strength in area 8 between a disk 2 made of piezoelectric material and an inside electrode 6 is smaller by a factor of 3 to 5 than the adhesive strength in area 7 between sintered disks 2 made of piezoelectric material.

FIG. 2A shows the condition of piezoelectric actuator 1 without an electric field E being applied. FIG. 2B shows expansion in the central area of actuator 1 because of the piezoelectric effect after a control voltage has been applied. However, there is no piezoelectric expansion in edge area 7, where there are no oppositely polarized inside electrodes arranged opposite one another, but instead disks 2 made of piezoelectric material are sintered through. Due to the expansion in the central area of piezoelectric actuator 1, tensile stresses occur in the edge area, frequently resulting in delamination 9 in the contact zone between inside electrodes 6 and disks 2 made of piezoelectric material in area 8.

As shown in FIG. 2B, this delamination 9 continues into the area of outside electrode 4. Such a crack 9' propagating into outside electrode 4 has a considerable negative effect on the contacting of inside electrodes 6. If crack 9' propagates completely through outside electrode 4, the contact in outside electrode 4 is interrupted and a portion of inside electrodes 6 no longer receives voltage. This greatly reduces the total expansion, i.e., the travel of actuator 1.

Various proposals have been made in the related art to guarantee continued functionality of actuator 1 when cracks 9' occur.

SUMMARY OF THE INVENTION

The piezoelectric actuator has the advantage over the related art that the outside electrodes applied in the form of a coating of electrically conductive polymer material on the outside of the stack are elastic. In the case of the actuator according to the present invention, tensile stresses occurring in the edge area of an outside electrode due to an applied voltage are absorbed by the elastic outside electrode without any tears or cracks occurring in the outside electrode. If a crack develops between the inside electrode and a disk made of piezoelectric material, it is subsequently stopped at the elastic outside electrode. A piezoelectric actuator provided with elastic outside electrodes solves the problem of cracks occurring in the outside electrodes of piezoelectric actuators in a simple and reliable manner.

In addition, it is extremely advantageous that this eliminates the etching and seeding of the outside surface of the actuator, which has previously been necessary in the manufacture of a conventional actuator 1 and is necessary in order to apply a nickel outside electrode, for example. With the etching required in the related art, there is always the risk of undercutting and subsequent detachment of the outside electrode in the operating state of the actuator.

BRIEF DESCRIPTION OF THE DRAWINGS

FIG. 8 shows a top view of an outside electrode of a piezoelectric actuator according to the present invention, a screen electrode having a constant width being arranged in the elastic, electrically conductive polymer material.

FIG. 9 shows a top view of an outside electrode of a piezoelectric actuator according to the present invention, a screen electrode having a width that decreases in one stack direction being arranged in the elastic, electrically conductive polymer material.

FIG. 10 shows a perspective view of an outside electrode of a piezoelectric actuator according to the present invention, the elastic, electrically conductive polymer material having a constant thickness over the entire area.

FIG. 11 shows a perspective view of an outside electrode of a piezoelectric actuator according to the present invention, the elastic, electrically conductive polymer material having a thickness that decreases along one stack direction.

DETAILED DESCRIPTION

Figure 1:
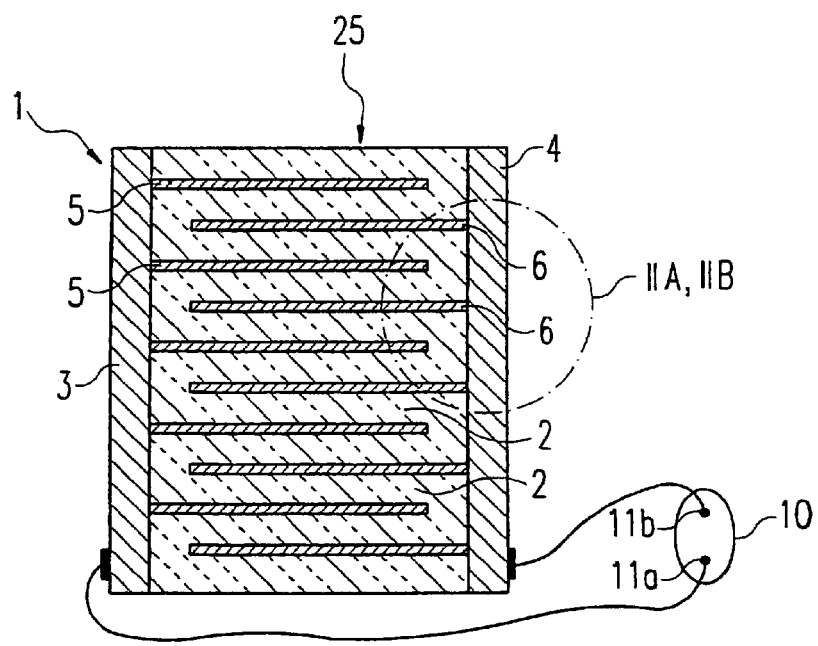
FIG. 1 shows a sectional diagram of a piezoelectric actuator known in the related art.
Figure 2A:
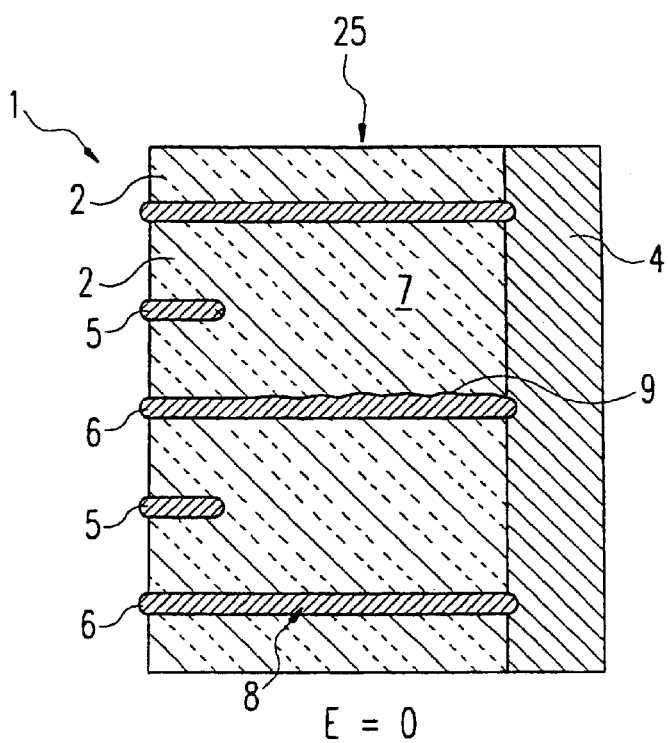
FIG. 2A shows an enlarged sectional diagram of detail IIA in FIG. 1, without an electric field E being applied to the actuator.
Figure 2B:
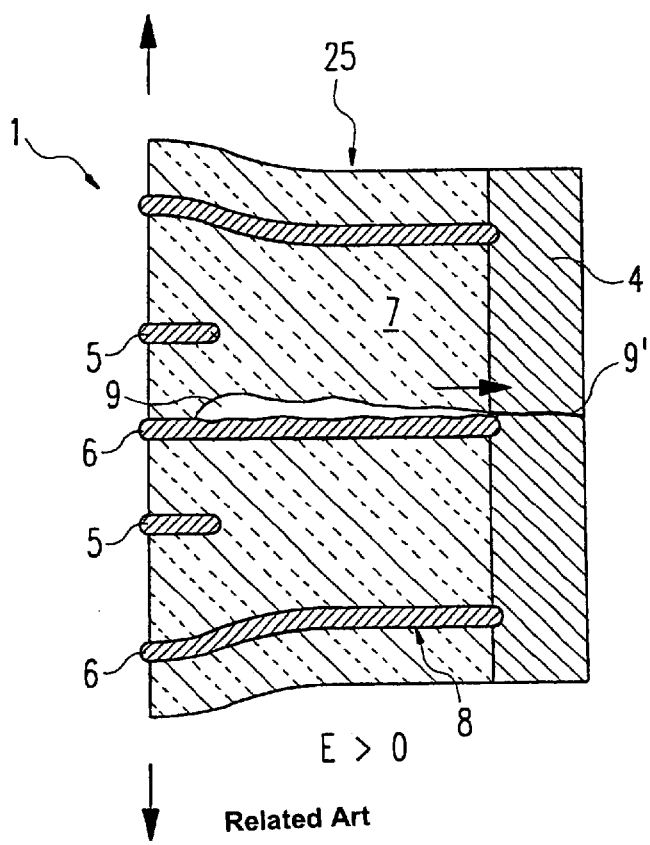
FIG. 2B shows an enlarged sectional diagram of detail IIB in FIG. 1, with an electric field E (E>0) being applied to the actuator.
Figure 3:
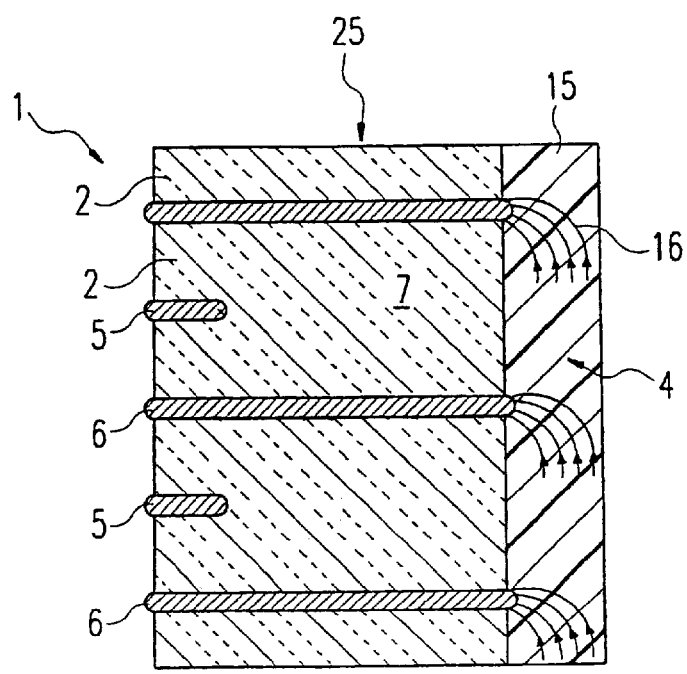
FIG. 3 shows a sectional diagram of an edge area of the piezoelectric actuator according to the present invention having an outside electrode made of an elastic, electrically conductive polymer material.

FIG. 3 shows a detail of an electrode edge area of a piezoelectric actuator 1 in a sectional diagram according to the present invention. Inside electrodes 5 and 6 are arranged in alternation, each being separated by a disk 2 made of piezoelectric material. In the embodiment according to FIG. 3, inside electrodes 6 are connected to the outside electrode made of an elastic, electrically conductive polymer material 15.

Examples of suitable piezoelectric materials to produce disks 2 include quartz, tourmaline, barium titanate ($BaTiO_3$) or special piezoceramics such as a lead zirconate-lead titanate system (PZT system) ($PbZrO_3$—$PbTiO_3$). According to the present invention, any piezoelectric material may also be used, including an organic salt such as potassium (sodium) tartrate, ethylenediamine tartrate or polymers such as PVDF, PVF, etc.

Any polymers that become electrically conductive when conductive fillers are added may be used as the elastic, electrically conductive polymer.

To achieve the desired degree of electric conductivity, these polymers may be mixed with conductive fillers such as carbon black, carbon fibers, nickel-coated mica, steel fibers, aluminum flakes, silver powder, silver spangles, copper powder, copper spangles, gold powder or gold-coated polymer beads.

However, the polymers may also contain polymers having an intrinsic electric conductivity such as cis- or trans-polyacetylene, poly(p-phenylene), polythiophene, polypyrrole, etc. These intrinsically electrically conductive polymers can then be obtained (doped) by treating them with strong oxidizing or reducing agents such as bromine, iodine, silver perchlorate, boron trifluoride, sodium naphthalene, arsenic pentafluoride, etc.

In the sense of the present invention, preferred polymers are silicone elastomers doped with metallic fillers such as silver. In addition, it is also preferable to use thermoplastic copolymers as the polymer material to be doped for the outside electrode.

Inside electrodes 5, 6 are usually made of metals, such as platinum, silver, copper, silver-palladium alloys, etc., which have a melting point above the sintering temperature of the piezoelectric materials used. In addition, inside electrodes 5, 6 can also be applied to disks 2 made of piezoelectric material by known conventional methods such as screen printing, sputtering, vapor deposition, etc.

In FIG. 3 the current flow to inside electrode 6 in elastic, electrically conductive polymer material 15 is represented by current lines 16. The connection of outside electrode 4 to control voltage source 10 is not shown here.

When using web-shaped inside electrodes, such as inside electrodes 6 illustrated in FIG. 3 projecting in the form of a web into elastic, electrically conductive polymer material 15, this reduces the current density, represented by current lines 16, across inside electrodes 6. This advantageously reduces local heating in the contact zone between inside electrode 6 and elastic, electrically conductive polymer material 15. Preventing high temperatures in the above-mentioned contact zone results in a longer lifetime of the actuator, because premature aging phenomena in polymer material 15 are prevented.

Figure 4:
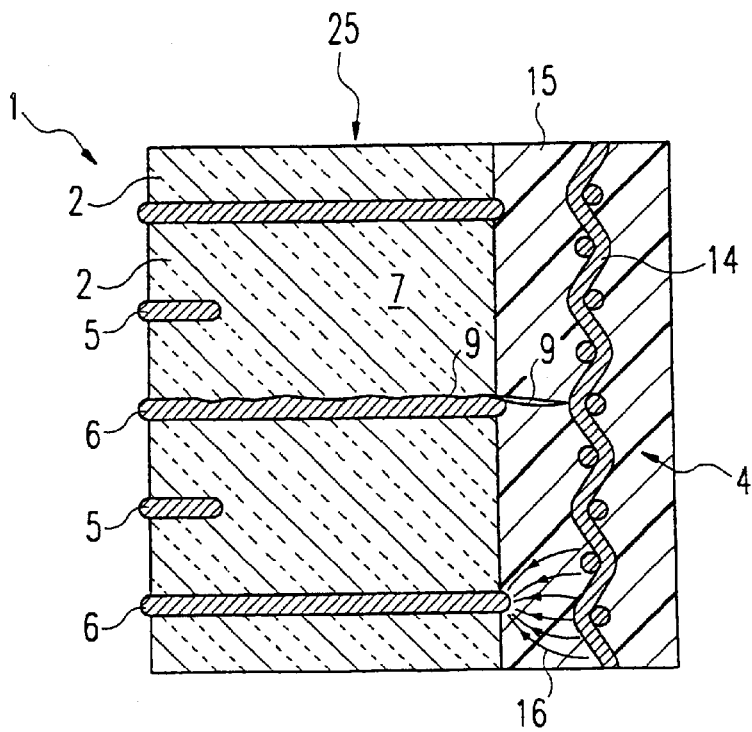
FIG. 4 shows a sectional diagram of an edge area of one embodiment of the piezoelectric actuator according to the present invention, a screen electrode being arranged in the elastic, electrically conductive polymer material.

FIG. 4 shows another advantageous embodiment of the present invention. According to FIG. 4, a screen electrode 14 is provided in elastic, electrically conductive polymer material 15. If a crack 9' develops between inside electrode 6 and a disk 2 made of piezoelectric material and if this crack 9' propagates from elastic, electrically conductive material 15 into outside electrode 4, the propagation of crack 9' is stopped at screen electrode 14. In addition, the embodiment according to the present invention as illustrated in FIG. 4 permits a more advantageous pattern of current lines 16. As already explained with regard to the embodiment illustrated in FIG. 3, in combination with a web electrode 6 projecting into polymer material 15, local heating in polymer material 15 is thus prevented, which ultimately results in an extended lifetime of piezoelectric actuator 1.

Figure 5:
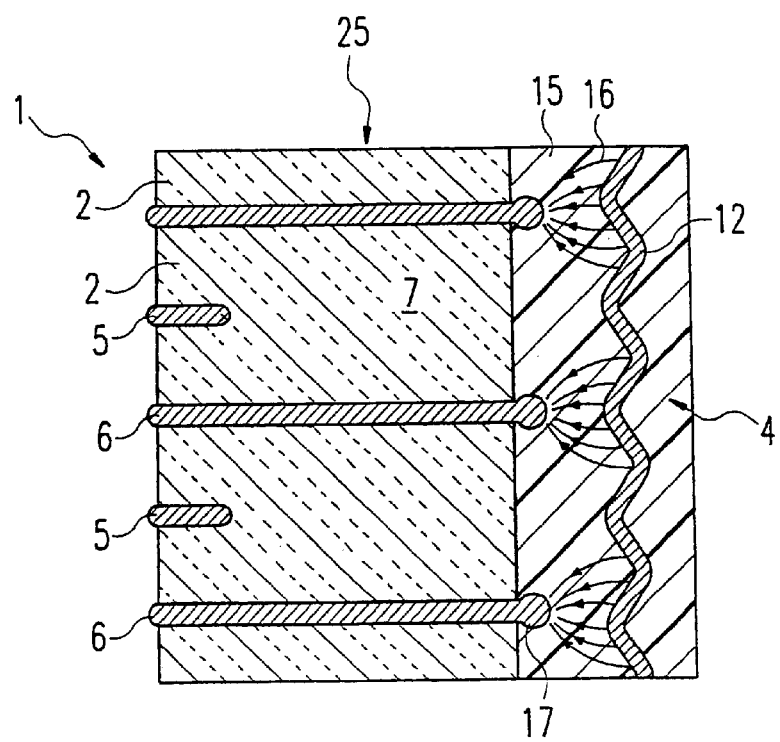
FIG. 5 shows a sectional diagram of an edge area of one embodiment of the piezoelectric actuator according to the present invention, the inside electrodes having cylindrical contacts in the contact zone with the elastic, electrically conductive polymer material.

FIG. 5 illustrates another preferred embodiment of the present invention. Inside electrodes 6 which project into elastic, electrically conductive polymer material 15 are provided with cylindrical contacts 17 in the contact zone with polymer material 15. Due to the increase in surface area, these cylindrical contacts 17 allow further reduction in current flow applied to inside electrode 6 per unit of area (reduced current density). Due to the additional arrangement of a metallic conductor, like undulated electrode 12 shown as an example in FIG. 5, the current line pattern can be further improved. Instead of ball contacts 17, however, any other way of enlarging the surface area may also be provided on inside electrodes 6, which project into the elastic, conductive polymer material 15; such elements which are not cylindrical may be button-shaped, conical, mushroom-shaped or disk-like attachments.

Inside electrodes 6 projecting into elastic, electrically conductive polymer material 15 in a web-like manner as shown in FIG. 4 or in a cylindrical or button-like manner as in FIG. 5 can be produced by controlled electrochemical structuring. For example, a stack 25 of disks 2 made of piezoelectric material and inside electrodes 6 applied between adjacent disks 2 are secured in a holder, and inside electrodes 6 to be structured are contacted electrically on the side opposite the side of actuator 1 to be structured, for example, and are structured by deposition of a metal in an electrolysis bath in a controlled manner.

It is naturally also possible to produce the projecting ends of inside electrodes 6 by using known photolithographic methods. A mask is first applied using an appropriate grid to the lateral face of actuator 1 where inside electrodes 6 are to project. After controlled deposition of the metal forming inside electrodes 6, the film forming the mask is dissolved in the traditional manner. Then elastic, electrically conductive polymer material 15, optionally containing another metallic conductive element, is applied to the projecting ends thus produced on inside electrode 6.

Figure 6:
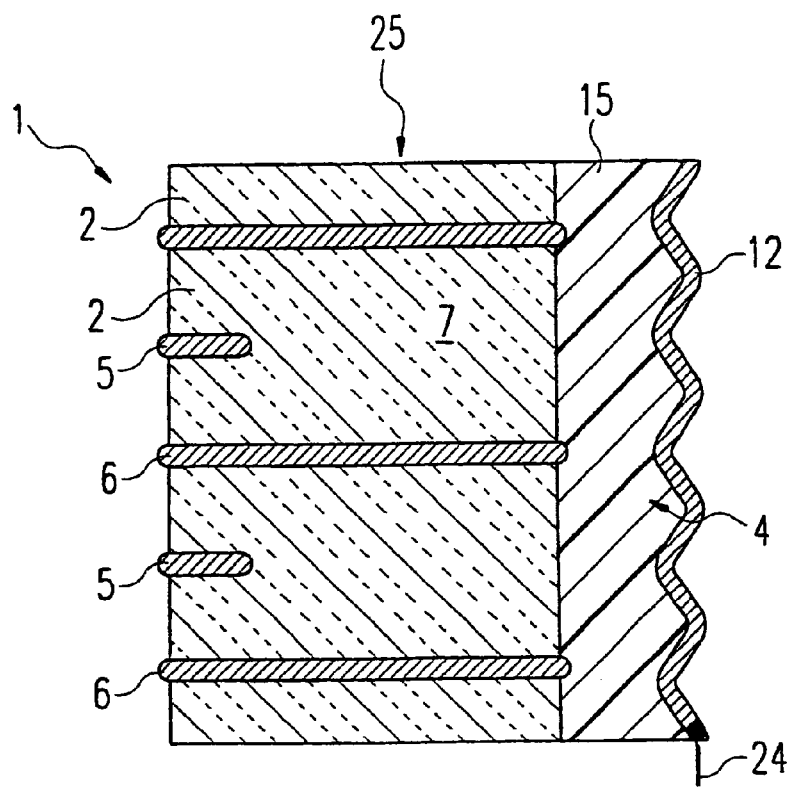
FIG. 6 shows a sectional diagram of an edge area of one embodiment of the piezoelectric actuator according to the present invention, an undulated electrode being applied to the elastic, electrically conductive polymer material.

FIG. 6 shows a detail of an electrode edge area of another actuator 1 according to the present invention. Elastic, electrically conductive polymer material 15 is in contact with inside electrodes 6 projecting laterally on the outside of the actuator. An undulated electrode 12 is applied to elastic, electrically conductive polymer material 15. Outside electrode 4 is then connected electrically to control voltage source 10 (not shown) by a terminal contact 24.

Figure 7:
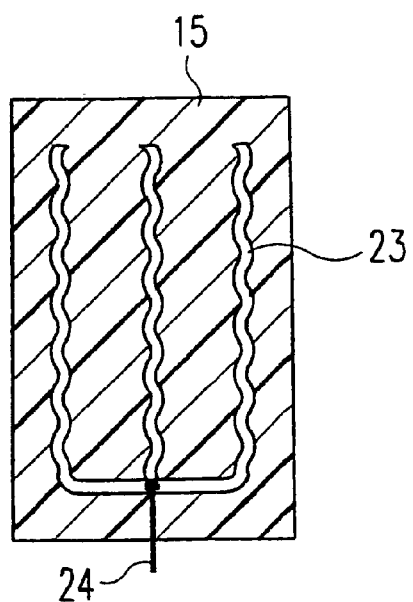
FIG. 7 shows a top view of an outside electrode of a piezoelectric actuator according to the present invention, multiple undulated wire electrodes being arranged in the elastic, electrically conductive polymer material.

Another arrangement of metallic conducting elements in elastic, electrically conductive polymer material 15 is shown as an example in FIG. 7.

FIG. 7 shows a top view of an outside electrode 4 applied along the outside of a stack of a piezoelectric actuator 1, with one or more wire electrodes 23 being embedded in elastic, electrically conductive polymer material 15.

It is self-evident that the metallic conducting element embedded in elastic, electrically conductive polymer material 15 may assume various geometric forms, such as a corrugated plate, a wire or undulated wire, expanded metal, spiral spring, etc.

In an additional arrangement of a metallic conducting element in elastic, electrically conductive polymer material 15, the metallic conducting element has no direct contact with inside electrodes 5, 6 which project, for example, like a web into elastic, electrically conductive polymer material 15. To this extent, electric contact between the metallic conducting element and inside electrodes 5, 6 is achieved exclusively through elastic, electrically conductive polymer material 15.

Introduction of a metallic conducting element into elastic, electrically conductive polymer material 15 yields a more favorable current line pattern, as illustrated in FIGS. 4 and 5 as an example and as explained above, and prevents local overheating at the contact point between inside electrode 6 and elastic, electrically conductive polymer material 15. Thus, premature aging phenomena are prevented with the elastic, electrically conductive polymer material 15. In addition, introduction of a metallic conducting element permits a reduction in thickness of the elastic, electrically conductive polymer material 15 applied. Finally, any cracks 9' propagating into polymer material 15 are stopped at the metallic conducting element in an extremely advantageous manner.

FIG. 8 shows a top view of an outside electrode 4 applied to the outside of stack 25 along one stack direction, with a screen electrode 14 embedded in elastic, electrically conductive polymer material 15. Screen electrode 14 has a constant width along the outside of the stack of actuator 1. Electric contact with control voltage source 10 is established over electric terminal contact 24.

FIG. 9 shows a top view of an outside electrode 4 corresponding to that in FIG. 8. In contrast with FIG. 8, the electric conducting element in the form of a screen electrode 14 embedded in elastic, electrically conductive polymer material 15 has a declining width along one stack direction on the outside of stack 25 of disks 2 made of piezoelectric material. Electric contact with control voltage source 10 is established via electric terminal contact 24 on wide end 19 of screen electrode 14. This trapezoidal design of screen electrode 14 takes into account the fact that the current density may be lower on narrow end 18 of screen electrode 14 facing away from electric terminal contact 24. The trapezoidal design of metallic conducting element shown in FIG. 9 as an example advantageously makes it possible to save on metallic electrode material, which can be expensive. The metallic conducting element shown in FIG. 9 as an example may of course also be solid, e.g., in the form of an undulated electrode made of a corrugated sheet metal.

FIG. 10 shows a perspective view of an outside electrode 4 made of an elastic, electrically conductive polymer material 15 applied to the outside of stack 25 of disks 2 made of piezoelectric material along one stack direction. Elastic, electrically conductive polymer material 15 has a constant thickness 20 over its entire length and width. Elastic, electrically conductive polymer material 15 is connected to control voltage source 10 by electric terminal contact 24.

FIG. 11 shows a perspective view of an outside electrode 4 which corresponds largely to that in FIG. 10, but where thickness 20 of elastic, electrically conductive polymer material 15 decreases along one stack direction. Control voltage source 10 is connected to thick end 21 of elastic, electrically conductive polymer material 15 by electric terminal contact 24. As noted above with regard to FIG. 9, the current density is lower on the side facing away from electric terminal contact 24, i.e., on thin end 22 of elastic, electrically conductive polymer material 15. An outside electrode designed according to FIG. 11 makes it possible to save on elastic, electrically conductive polymer material 15 in an advantageous manner and thus permits a less expensive method of producing actuator 1.

The embodiments of the present invention illustrated as examples in FIGS. 9 and 11 may of course also be combined, so that the thickness of elastic, electrically conductive polymer material 15 decreases along the stack direction on the outside of the stack of disks 2 made of piezoelectric material in that the width of a metallic conducting element arranged in elastic, electrically conductive polymer material 15 also decreases. Control voltage source 10 is then connected electrically to thick end 21 of elastic, electrically conductive polymer material 15 as well as to wide end 19 of an embedded screen electrode 14, for example. This extremely advantageous combination makes it possible to save on both electrode material and polymer material 15. In addition, other combinations of the embodiments illustrated in FIGS. 8 through 11 are of course also possible.

In addition, other basic geometric shapes such as actuators having a hexagonal or octagonal base area, etc. are also covered by the present invention, with outside electrodes 4 made of an elastic, electrically conductive polymer material 15 being arranged on the outside of the stack with or without the metallic conductor embedded or applied.

Piezoelectric actuator 1 according to the present invention may be used to advantage as a final controlling element. In particular, piezoelectric actuator 1 according to the present invention can be used in direct fuel injection systems and in diesel injection systems such as common rail injection systems or unit injection systems (pump nozzle units).

What is claimed is:

1. A piezoelectric actuator, comprising:
   a plurality of disks made of a piezoelectric material and arranged in a stack in one stack direction;
   a plurality of flat inside electrodes arranged in alternation with the plurality of disks; and
   at least two outside electrodes applied to an outside of the stack along the stack direction, each of the plurality of flat inside electrodes being connected in alternation to one of the at least two outside electrodes via a contact zone, and the at least two outside electrodes being applied to the outside of the stack as a coating of an elastic, electrically conductive polymer material, wherein:
   the coating has a declining thickness along the stack direction, and
   a control voltage source is connectable to a thick end of the coating.

2. The piezoelectric actuator according to claim 1, wherein:
   the piezoelectric material includes a lead zirconate-lead titanate system.

3. The piezoelectric actuator according to claim 1, wherein:
   the elastic, electrically conductive polymer material is doped with a metallic filler.

4. The piezoelectric actuator according to claim 1, further comprising:
   at least one metallic conducting element arranged one of in and on the elastic, electrically conductive polymer material.

5. The piezoelectric actuator according to claim 4, wherein:

the at least one metallic conducting element has a width that tapers along the stack direction, and the control voltage source can be connected to a wide end of the at least one metallic conducting element.

6. A piezoelectric actuator; comprising:

a plurality of disks made of a piezoelectric material arranged in a stack in a stack direction;

a plurality of flat inside electrodes arranged in alternation with the plurality of disks;

at least two outside electrodes applied to an outside of the stack along the stack direction, each of the plurality of flat inside electrodes being connected in alternation to one of the at least two outside electrodes via a contact zone, and the at least two outside electrodes being applied to the outside of the stack as a coating made of an elastic, electrically conductive polymer material; and at least one metallic conducting element arranged one of in and on the elastic, electrically conductive polymer material, wherein:

the at least one metallic conducting element has a width that tapers along one stack direction, and a control voltage source is connectable to a wide end of the at least one metallic conducting element.

7. The piezoelectric actuator according to claim 6, wherein:

the at least one metallic conducting element has a trapezoidal shape.

8. The piezoelectric actuator according to claim 6, wherein:

the piezoelectric material includes a lead zirconate-lead titanate system.

9. The piezoelectric actuator according to claim 6, wherein:

the elastic, electrically conductive polymer material is doped with a metallic filler.

10. The piezoelectric actuator according to claim 6, wherein:

the coating has a declining thickness along the stack direction, and the control voltage source is connectable to a thick end of the coating.

11. The piezoelectric actuator according to claim 1, further comprising:

an arrangement for increasing a surface area and by which an area of the contact zone between the plurality of flat inside electrodes and the at least two outside electrodes is enlarged.

12. The piezoelectric actuator according to claim 6, further comprising:

an arrangement for increasing a surface area and by which an area of the contact zone between the plurality of flat inside electrodes and the at least two outside electrodes is enlarged.

* * * * *